(12) United States Patent
Cheng et al.

(10) Patent No.: US 11,997,795 B2
(45) Date of Patent: May 28, 2024

(54) SUCTION NOZZLE ASSEMBLY

(71) Applicant: TRIPLE WIN TECHNOLOGY(SHENZHEN) CO.LTD., Shenzhen (CN)

(72) Inventors: Kai-Ke Cheng, Jincheng (CN); Hang Wu, Jincheng (CN); Yan-Xin Feng, Jincheng (CN); Peng-Cheng Niu, Jincheng (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 30 days.

(21) Appl. No.: 17/741,571

(22) Filed: May 11, 2022

(65) Prior Publication Data
US 2023/0007818 A1    Jan. 5, 2023

(30) Foreign Application Priority Data
Jul. 1, 2021 (CN) .......................... 202121485119.4

(51) Int. Cl.
*H05K 13/04* (2006.01)
(52) U.S. Cl.
CPC .................................. *H05K 13/041* (2018.08)

(58) Field of Classification Search
CPC .......................... H05K 13/0409; H05K 13/041
See application file for complete search history.

(56) References Cited

U.S. PATENT DOCUMENTS

| | | | |
|---|---|---|---|
| 6,305,729 B1* | 10/2001 | Mukasa | C03B 11/08 294/185 |
| 7,878,564 B2* | 2/2011 | Kang | H01L 21/6838 294/186 |
| 2002/0074379 A1* | 6/2002 | Kim | B23K 3/08 228/49.5 |
| 2012/0193500 A1* | 8/2012 | Kniss | B65G 49/061 248/363 |
| 2017/0291308 A1* | 10/2017 | Yamamuro | B25J 15/0666 |

* cited by examiner

*Primary Examiner* — Paul D Kim
(74) *Attorney, Agent, or Firm* — ScienBiziP, P.C.

(57) ABSTRACT

A suction nozzle assembly used in manufacture for the gentlest handling of delicate components such as a camera lens includes a suction nozzle rod and a suction nozzle member. The suction nozzle rod includes a first through hole. The suction nozzle member includes a main body and a suction nozzle located on both sides of the main body. The main body includes a second through hole connected to the first through hole, and a third through hole connected to the second through hole. The suction nozzle includes at least one suction nozzle hole connected to the third through hole. The disclosure also provides a suction device having the suction nozzle assembly.

8 Claims, 4 Drawing Sheets

SUCTION NOZZLE ASSEMBLY

FIELD

The subject matter herein generally relates to a suction nozzle assembly and a suction device including the suction nozzle assembly.

BACKGROUND

Camera module may include a flexible printed circuit board (FPCB) and a lens glued on the FPCB. During the manufacture of such a camera module, a gripper is used to move the lens onto the FPCB, and the use of gripper can protect passive components such as sensors, wires, capacitors and memory chips on the FPCB. The gripper includes a gripper body fixed magnetically on a machine or with a top wire, and a rubber suction nozzle connected with the gripper body. The rubber suction nozzle lifts the lens and moves the lens to the FPCB when driven by the gripper body. However, the rubber suction nozzle may cause damage when lifting and moving the lens.

BRIEF DESCRIPTION OF THE DRAWINGS

Implementations of the present disclosure will now be described, by way of embodiments, with reference to the attached figures.

DETAILED DESCRIPTION

Figure 1:
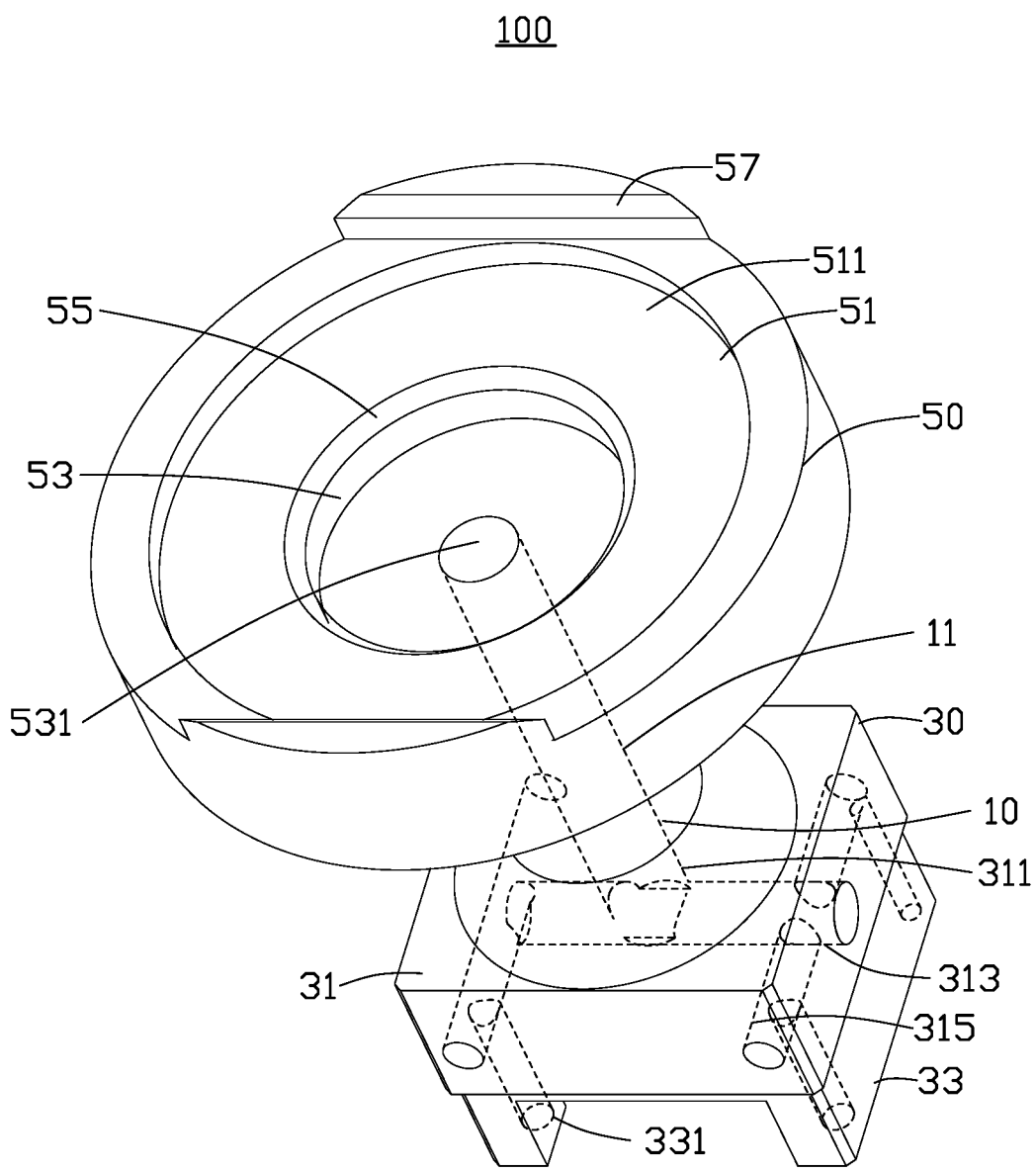
FIG. 1 is a diagrammatic view of an embodiment of a suction nozzle assembly according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
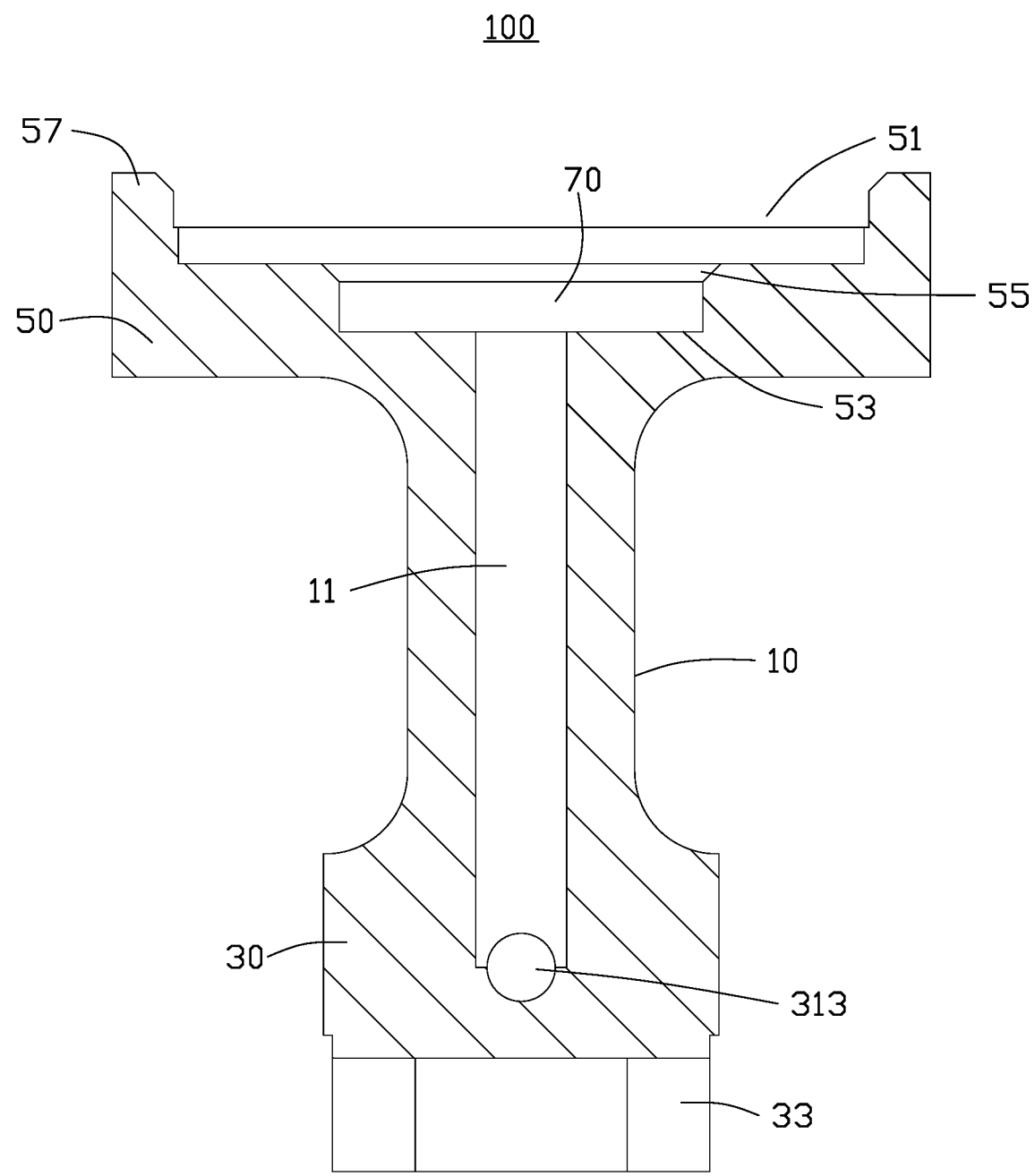
FIG. 2 is a sectional, diagrammatic view of the suction nozzle assembly of FIG. 1.
Figure 3:
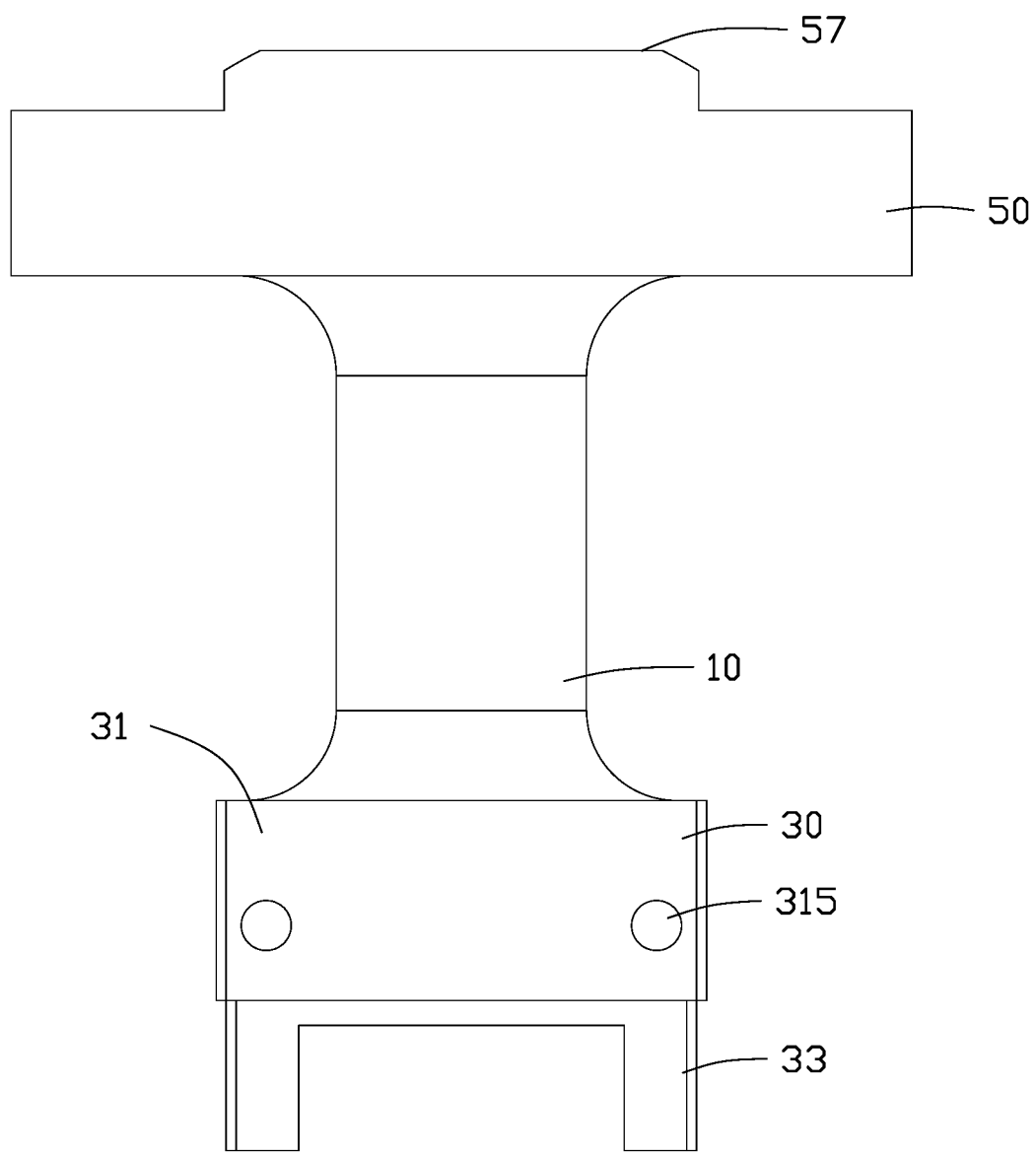
FIG. 3 is a side, diagrammatic view of the suction nozzle assembly of FIG. 1.

FIGS. 1, 2 and 3 illustrate a suction nozzle assembly 100 in one embodiment. The suction nozzle assembly 100 includes a suction nozzle rod 10 and a suction nozzle member 30.

In at least one embodiment, the suction nozzle rod 10 includes a first through hole 11. The suction nozzle member 30 includes a main body 31 and a suction nozzle 33 located on both sides of the main body 31. The main body 31 includes a second through hole 311 connected to the first through hole 11, and a third through hole 313 connected to the second through hole 311. The suction nozzle 33 includes at least one suction nozzle hole 331 connected to the third through hole 313.

In at least one embodiment, both ends of the third through hole 313 are sealed by a filler (not shown) to facilitate vacuum-creation in the suction nozzle assembly 100.

In at least one embodiment, a diameter of the first through hole 11 is in a range of 0.1 mm to 0.3 mm, and 0.2 mm is preferred.

In at least one embodiment, a diameter of the second through hole 311 is in a range of 0.1 mm to 0.3 mm, and 0.2 mm is preferred.

In at least one embodiment, a diameter of the third through hole 313 is in a range of 0.1 mm to 0.3 mm, and 0.2 mm is preferred.

In at least one embodiment, a diameter of the suction nozzle hole 331 is in a range of 0.1 mm to 0.3 mm, and 0.2 mm is preferred.

Because a suction nozzle 33 is located on both sides of the main body 31, the suction nozzle 33 can lift a lens barrel instead of just the lens. Thus, the suction nozzle assembly 100 safely and stably moves the lens to a printed circuit board without damaging the lens. The lens damage rate of the suction nozzle assembly 100 is less than 5%.

In at least one embodiment, the main body 31 further includes at least two fourth through holes 315 facing to each other. The at least two fourth through holes 315 are connected to the third through hole 313. The at least two fourth through holes 315 are connected to the suction nozzle hole 331.

In at least one embodiment, both ends of each of the at least two fourth through holes 315 are sealed by a filler (not shown) to facilitate the creation of a vacuum in the suction nozzle assembly 100.

In at least one embodiment, a diameter of the fourth through holes 315 is in a range of 0.1 mm to 0.3 mm, and 0.2 mm is preferred.

In at least one embodiment, a central axis of each of the at least two fourth through holes 315 is perpendicular to a central axis of the third through hole 313. Thus, the fourth through hole 315 can be connected to the suction nozzle hole 331.

When evacuating the suction nozzle assembly 100, air is sucked out through the first through hole 11, the second through hole 311, the third through hole 313, the fourth through hole 315, and the suction nozzle hole 331, so that the suction nozzle hole 331 can make firm contact with the lens barrel over a wide area.

In an embodiment, each suction nozzle 33 includes two suction nozzle holes 331 located at each end of the suction nozzle 33 for lifting the lens barrel.

In at least one embodiment, the suction nozzle assembly 100 further includes a first connecting component 50 connected to the suction nozzle rod 10. The first connecting component 50 includes a groove 51. The groove 51 is used to receive a vacuum component (not shown) for creating a vacuum in the suction nozzle assembly 100.

In at least one embodiment, the suction nozzle assembly 100 further includes at least one limiting block 57. The limiting block 57 is located on an inner wall of the groove 51 to facilitate the assembly of the vacuum component in the groove 51.

In at least one embodiment, the suction nozzle assembly 100 further includes a second connecting component 70 connected with the vacuum component. The groove 51 includes a bottom wall 511. The bottom wall 511 includes a receiving groove 53 for receiving the second connecting component 70 to facilitate the creation of a vacuum in the suction nozzle assembly 100 by the vacuum component. The bottom wall of the receiving groove 53 includes a connecting hole 531 connected to the first through hole 11.

In at least one embodiment, the second connecting component 70 is a magnet or a wire belt.

In at least one embodiment, the second connecting component 70 is engaged with the receiving groove 53 by an interference fit.

In at least one embodiment, a diameter of the receiving groove 53 is in a range of 0.6 mm to 1 mm, and 0.8 mm is preferred.

In at least one embodiment, each of the suction nozzle rod 10, the suction nozzle member 30, and the first connecting component 50 is an integrated structure. Thus, the suction nozzle component 100 is easily replaced, as it can be taken out as a whole. In at least one embodiment, a strength of vacuum in the suction nozzle assembly 100 can reach −70 Kp.

In at least one embodiment, the bottom wall 511 further includes a holding groove 55 connected to the receiving groove 53. The holding groove 55 is located between the groove 51 and the receiving groove 53. Thus, the upper surface of the second connecting component 70 received in the receiving groove 53 is not higher than the bottom wall 511. A diameter of the holding groove 55 is larger than that of the receiving groove 53 to facilitate the assembly of the second connecting component 70 in the receiving groove 53.

In at least one embodiment, the suction nozzle rod 10, the suction nozzle member 30, and the first connecting component 50 may be made of metal. In at least one embodiment, the suction nozzle member 30 can be polished or outlined for identification accuracy of the suction nozzle member 30. The nozzle device 30 has high wear-resistance, and is pollution-free, easy to clean, and has long service life and low cost.

Figure 4:
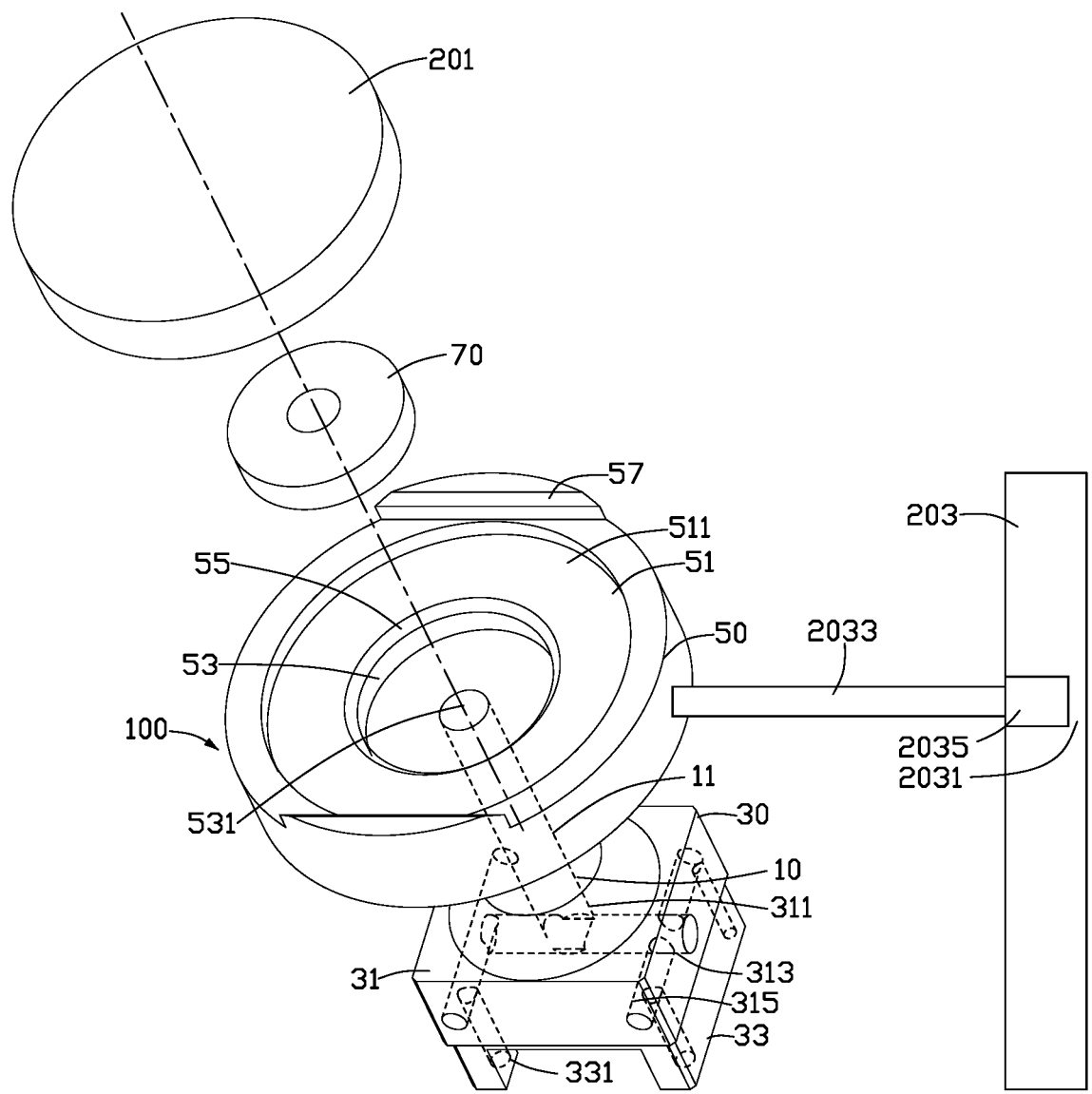
FIG. 4 is an exploded, diagrammatic view of a suction device according to the present disclosure.

FIG. 4 illustrates a suction device 200 in one embodiment. The suction device 200 includes the suction nozzle assembly 100, a vacuum component 201, and a moving component 203. The vacuum component 201 is connected with the suction nozzle assembly 100. The vacuum component 201 is used for vacuum creation in the suction nozzle assembly 100.

The moving component 203 is connected with the suction nozzle assembly 100. The moving component 203 is used to move the suction nozzle assembly 100 to a suitable position. In at least one embodiment, the moving component 203 includes a bracket 2031, a moving rod 2033 movably located on the bracket 2031, and a motor 2035 for driving the moving rod 2033. One end of the moving rod 2033 far from the bracket 2031 is connected with the first connecting component 50 to drive the suction nozzle assembly 100 to move.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A suction nozzle assembly comprising:
a suction nozzle rod comprising a first through hole; and
a suction nozzle member comprising a main body and a suction nozzle respectively located on a side of the main body, wherein the main body comprises a second through hole connected to the first through hole, and a third through hole connected to the second through hole, the suction nozzle comprises at least one suction nozzle hole connected to the third through hole, the main body further comprises at least two fourth through holes facing each other, each of the at least two fourth through holes is connected to the third through hole, and each of the at least two fourth through holes is connected to each of the at least one suction nozzle hole.

2. The suction nozzle assembly of claim 1, wherein a central axis of each of the at least two fourth through holes is perpendicular to a central axis of the third through hole.

3. The suction nozzle assembly of claim 1, wherein ends of each of the at least two fourth through holes are sealed.

4. The suction nozzle assembly of claim 1, wherein ends of the third through hole are sealed.

5. The suction nozzle assembly of claim 1, further comprising a first connecting component connected with the nozzle rod, wherein the first connecting component comprises a groove configured for a vacuum component.

6. The suction nozzle assembly of claim 5, further comprising a second connecting component connected with the vacuum component, wherein the groove comprises a bottom wall, the bottom wall comprises a receiving groove configured for receiving the second connecting component, and the bottom wall further comprises a connecting hole connected to the first through hole.

7. The suction nozzle assembly of claim 6, wherein the second connecting component is a magnet or a top wire, the bottom wall further comprises a holding groove connected to the receiving groove, the holding groove is located between the groove and the receiving groove, and a diameter of the holding groove is larger than a diameter of the receiving groove.

8. The suction nozzle assembly of claim 5, wherein the suction nozzle rod, the suction nozzle member, and the first connecting component are an integrated structure.

* * * * *